(12) United States Patent
Kim et al.

(10) Patent No.: US 7,554,620 B2
(45) Date of Patent: Jun. 30, 2009

(54) ELECTRO-STATIC DISCHARGE STRUCTURE FOR TERMINAL WITH LCD MODULE

(75) Inventors: Soo-Hyung Kim, Suwon-si (KR); Young-Tack Cho, Seoul (KR); Young-Min Kang, Seoul (KR); Seung-Bae Pyon, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 477 days.

(21) Appl. No.: 11/348,983

(22) Filed: Feb. 7, 2006

(65) Prior Publication Data

US 2006/0268187 A1 Nov. 30, 2006

(30) Foreign Application Priority Data

May 26, 2005 (KR) .................. 10-2005-0044316

(51) Int. Cl.
*G02F 1/1333* (2006.01)

(52) U.S. Cl. .................. 349/40; 349/59; 361/681; 345/87

(58) Field of Classification Search .................. 349/40, 349/54–55, 58–60, 192; 361/681; 345/87
See application file for complete search history.

(56) References Cited

U.S. PATENT DOCUMENTS

| | | | | |
|---|---|---|---|---|
| 6,392,622 | B1 * | 5/2002 | Ozawa | 345/92 |
| 2002/0154474 | A1 * | 10/2002 | Merz et al. | 361/683 |
| 2003/0161093 | A1 * | 8/2003 | Lam et al. | 361/681 |
| 2004/0192110 | A1 * | 9/2004 | Yen | 439/607 |
| 2005/0124208 | A1 * | 6/2005 | Peng et al. | 439/425 |
| 2005/0285991 | A1 * | 12/2005 | Yamazaki | 349/58 |

FOREIGN PATENT DOCUMENTS

| | | | |
|---|---|---|---|
| JP | 11-190835 | | 7/1999 |
| JP | 2000-308726 | | 11/2000 |
| JP | 2001-320193 | | 11/2001 |
| JP | 2002261484 A | * | 9/2002 |

* cited by examiner

Primary Examiner—Julie Ngo
(74) Attorney, Agent, or Firm—The Farrell Law Firm, LLP

(57) ABSTRACT

An ESD structure in an LCD module mounting structure in a terminal for mounting an LCD module on the inner surface of a case frame to be exposed through an opening of a predetermined size formed on the case frame. In the ESD structure, an EMI shielding is formed to be electrically connected to a main board of the terminal and grounded by coating EMI spray all over the inner surface of the case frame including a part of an overlap between the inner surface of the case frame and the LCD module. At least one through hole penetrates from the inner surface to the outer surface of the case frame at an appropriate portion of the overlap. Conductive means electrically connects the inner surface of the through hole to the EMI shielding. Therefore, externally introduced static electricity is actively grounded inside the terminal along the through hole.

18 Claims, 6 Drawing Sheets

ELECTRO-STATIC DISCHARGE STRUCTURE FOR TERMINAL WITH LCD MODULE

PRIORITY

This application claims priority under 35 U.S.C. § 119 to an application entitled "Electro-Static Discharge Structure For Terminal With LCD Module" filed in the Korean Intellectual Property Office on May 26, 2005 and assigned Serial No. 2005-44316, the contents of which are incorporated herein by reference.

BACKGROUND OF THE INVENTION

1. Field of the Invention

The present invention relates generally to an Electro-Static Discharge (ESD) structure for protecting a Liquid Crystal Display (LCD) module and other components in a terminal, and in particular, to an ESD structure for protecting an LCD module and other components in a terminal by preventing the degradation of radiation performance caused by noise arising from high voltage of an LCD module and increasing robustness against external ESD.

2. Description of the Related Art

In general, electronic communication products are equipped with a display including an LCD panel to indicate operation states to users. Regarding a wireless portable terminal, its trend is toward small size, lightweight, and diversified function. Terminals have been commercialized to meet various user demands. For example, they have a plurality of speakers for emitting polyphonic melodies and a high-resolution color display for displaying images in tens of thousands of pixels to millions of pixels. Developmental efforts are being expended to further develop such functions.

With the recent deployment of Digital Multimedia Broadcasting (DMB), the importance of the LCD module has been increasing and wireless portable terminals with functions suited for the high-resolution color display are on the market. For instance, they provide transmission of moving pictures, gaming, and video calls, and have an optical photographing system serving as a digital camera or a camcorder. Accordingly, the high-resolution color LCD module must be protected against an increased clock frequency and a high voltage due to the increase in the number of pixels. In this context, a need exists for a device for appropriately grounding the high voltage.

Moreover, unexpected external introduction of static electricity ranges from a few kilovolts to tens of kilovolts, for example, adversely affecting an LCD module and other components in a terminal. As a result, the terminal may malfunction or be damaged. Hence terminal manufactures compete each other to develop an ESD structure for also appropriately grounding static electricity introduced to the terminal.

Traditionally, an ESD structure is installed on a case frame with the LCD module mounted therein in the terminal since the LCD module is most susceptible to external static electricity. For example, the ESD structure is implemented by partially coating Electro-Magnetic Interference (EMI) paint around the corners of an opening through which the LCD panel is exposed, that is, on the mounting surface of the LCD panel, and then fixing the LCD module on the coating, to thereby discharge external static electricity.

The conventional ESD structure, however, has limitations in maintaining stable ESD capability because practically the EMI pigment is hard to coat uniformly lengthwise on the mounting surface of the LCD module due to spatial limits in terms of terminal size.

SUMMARY OF THE INVENTION

An object of the present invention is to substantially solve at least the above problems and/or disadvantages and to provide at least the advantages below. Accordingly, the present invention provides an ESD structure in a terminal, for actively discharging external static electricity.

The present invention provides an ESD structure installed in an LCD module mounting structure in a terminal, for increasing the robustness of the terminal, and for actively discharging static electricity in order to improve the quality of the terminal.

According to one aspect of the present invention, in an ESD structure in an LCD module mounting structure for a terminal, for mounting an LCD module on the inner surface of a case frame to be exposed through an opening of a predetermined size formed on the case frame, an EMI shielding is formed to be electrically connected to a main board of the terminal and grounded by coating EMI spray all over the inner surface of the case frame including a part of an overlap between the inner surface of the case frame and the LCD module. At least one through hole is formed to penetrate from the inner surface of the case frame to the outer surface of the case frame at an appropriate portion of the overlap. Conductive means electrically connects the inner surface of the at least one through hole to the EMI shielding. Therefore, externally introduced static electricity is actively grounded inside the terminal along the at least one through hole.

According to another aspect of the present invention, in an LCD module mounting structure for ESD in a terminal, a case frame has an opening of a predetermined size at the center thereof. On the inner surface of the case frame, EMI spray is coated over a predetermined area to be electrically grounded to a main board of the terminal. An LCD module is mounted on the inner surface of the case frame to be exposed through the opening. At least one through hole of a predetermined diameter is formed in an overlap between the case frame and the LCD module. Conductive means electrically connects the inner surface of the at least one through hole to the EMI spray of the case frame. Therefore, externally introduced static electricity is actively grounded inside the terminal along the at least one through hole.

It is preferred that the at least one through hole penetrates from the inner surface to the outer surface of the case frame and is electrically connected to the EMI spray, so that external static electricity is discharged rapidly by the EMI spray through the through hole. As well known, the EMI spray is electrically connected to a connector on the main board of the terminal by a predetermined connection means.

BRIEF DESCRIPTION OF THE DRAWINGS

The above and other objects, features and advantages of the present invention will become more apparent from the following detailed description when taken in conjunction with the accompanying drawings in which.

DETAILED DESCRIPTION OF THE PREFERRED EMBODIMENTS

Preferred embodiments of the present invention will be described herein below with reference to the accompanying drawings. In the following description, well-known functions or constructions are not described in detail since they would obscure the invention in unnecessary detail.

The following description is made with the appreciation that a slide and rotation-type terminal is shown just for illustrative purposes and thus the present invention is not limited to such a terminal, but is applicable to any electronic appliance with an LCD module as well as any terminal with a display having an LCD module, such as a bar type, a flip type, a folder type, a flip-up type, a pop-up type, and a slide type terminal.

Figure 1:
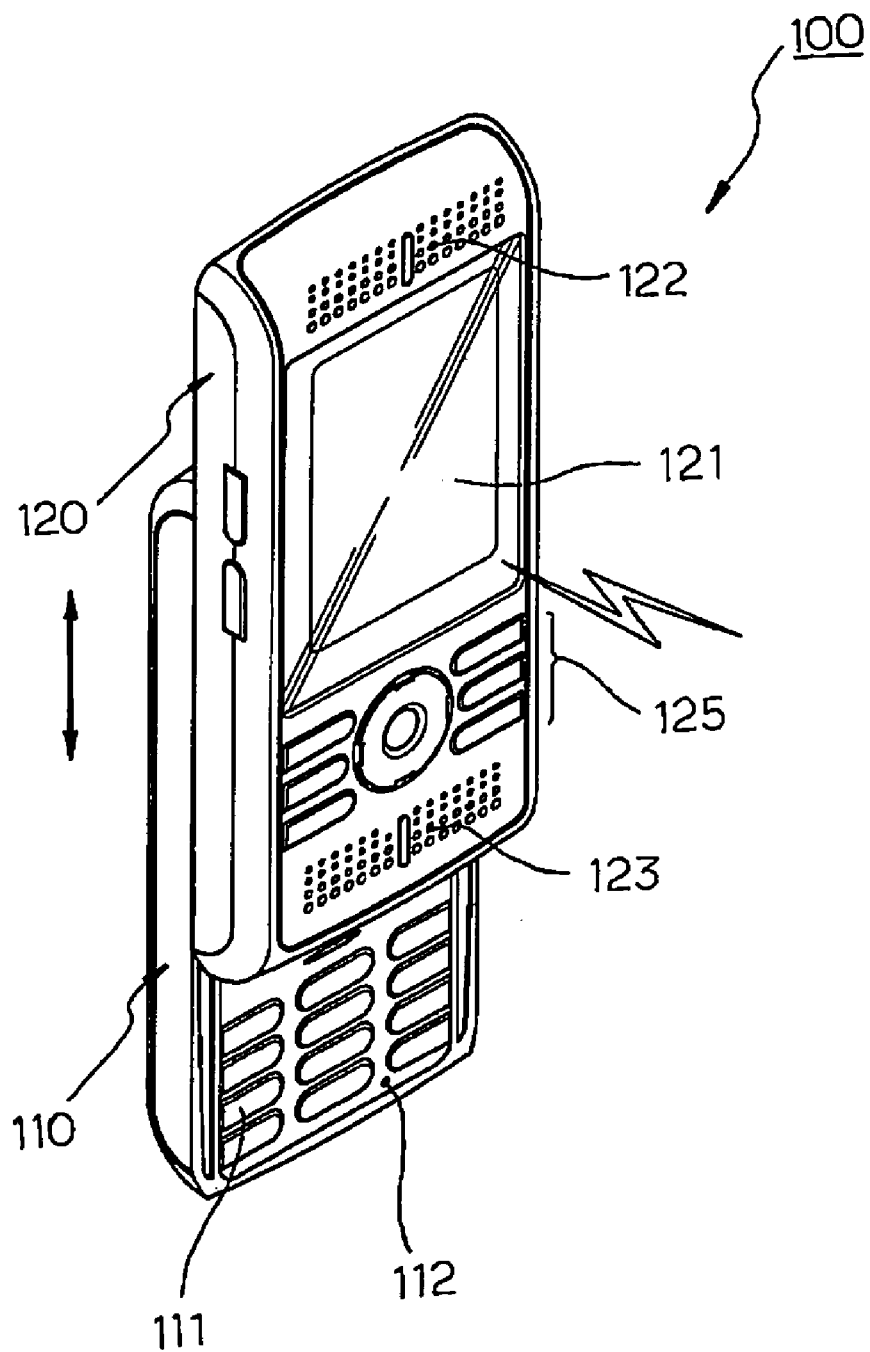
FIG. 1 is a perspective view of a wireless portable terminal according to an embodiment of the present invention.
Figure 2:
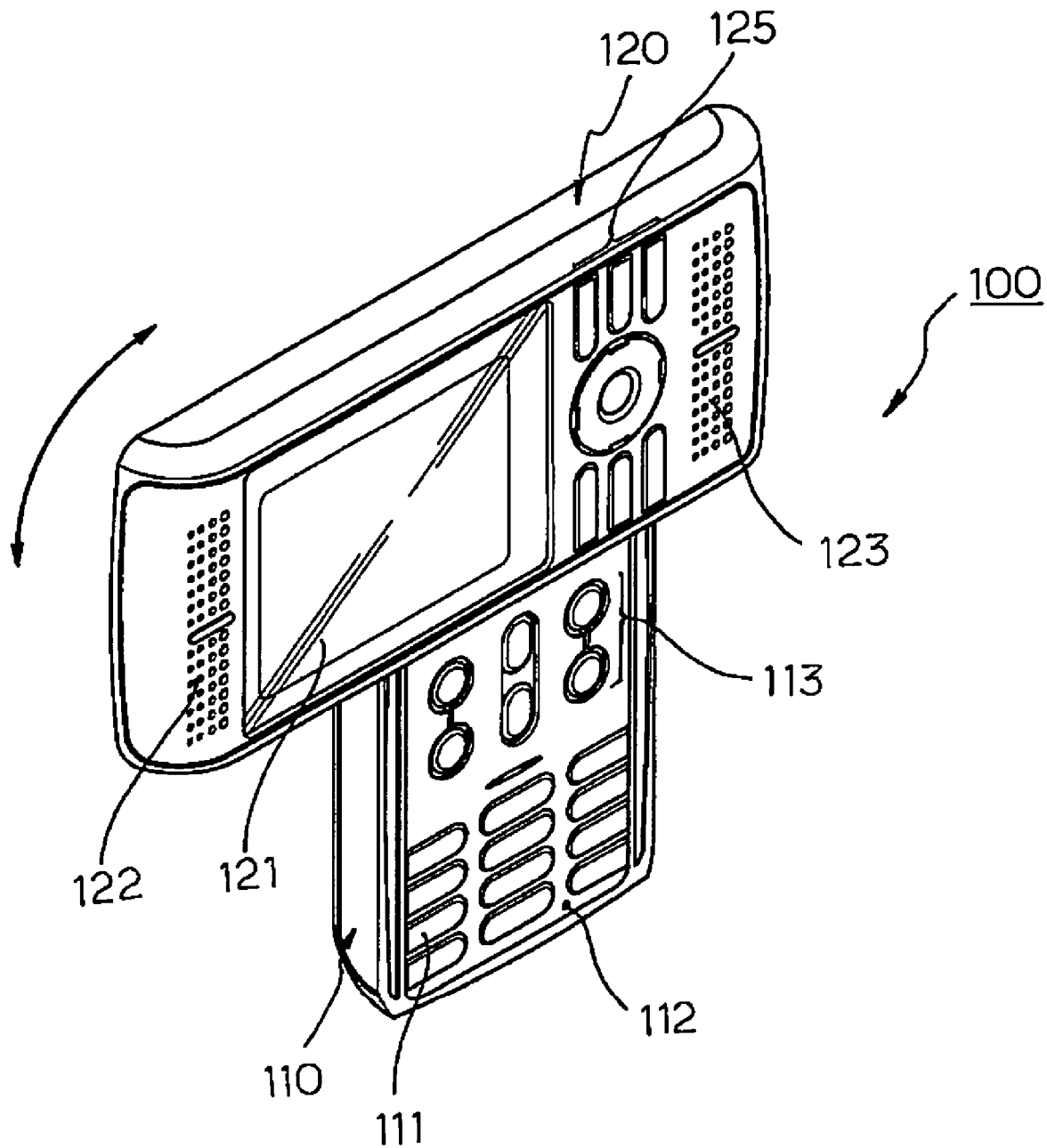
FIG. 2 is a perspective view of the wireless portable terminal with a sub-body having been slid and then rotated according to the embodiment of the present invention.

FIGS. 1 and 2 are a perspective view and an operation view, respectively of a wireless portable terminal 100 according to the present invention. A sub-body slides lengthwise a predetermined distance from a main body as illustrated in FIG. 1, and then rotates as illustrated in FIG. 2 depending on a user-selected operation. In the state illustrated in FIG. 1, a basic call operation can be performed, whereas in the state illustrated in FIG. 2, a user can conveniently enjoy additional functions including gaming or moving pictures through the wireless portable terminal 100.

Referring to FIG. 1, the wireless portable terminal 100 includes a main body 110 with a main board, i.e. a Radio Frequency (RF) board (not shown) and a sub-body 120 movable over the main body 110 in several ways. The main body 110 may be provided with a plurality of key buttons 111 (e.g. a 3×4 alphanumeric key array) and additional key buttons 113 above the key buttons 111, which can be pressed when the sub-body 120 slides and is then rotated over the main body 110. A microphone 112 is disposed under the key buttons 111, for sending voice to the other party.

The sub-body 120 is provided with a display 121 having an ESD structure according to the present invention. For the display 121, an LCD module is mounted on a case frame, as described below. To be more specific, the LCD module is fixed in an upper case frame forming the sub-body 120. A plurality of key buttons 125 can be further provided under the display 120. The key buttons 125 are preferably navigation key buttons that can be easily manipulated when the sub-body 120 is closed on the main body 110. As illustrated in FIG. 2, first and second speakers 122 and 123 can be installed at upper and lower end portions of the sub-body 120. The speakers 122 and 123 can function as stereo speakers for moving pictures or games. The first speaker 122 can serve the dual purpose of a receiver and a speaker phone during a call.

Figure 3:
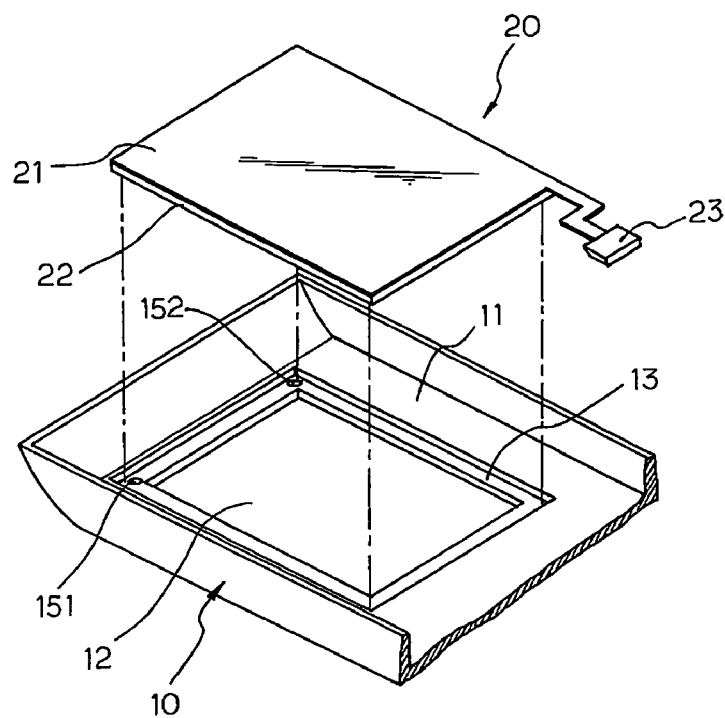
FIG. 3 is a partial rear perspective view of a case frame with an LCD module mounting structure according to the embodiment of the present invention.

FIG. 3 is a partial rear perspective view of a case frame 10 with an LCD module mounting structure according to the present invention. An LCD module 20 is fixed on the inner surface 11 of the case frame 10. In the LCD module 20, an LCD panel 22 is mounted on a Flexible Printed Circuit (FPC) 21 including a predetermined connector 23. An opening 12 of a predetermined size is formed at the center of the case frame 10 so that the user can view the LCD module 20. Preferably, the opening 12 is smaller than the LCD module 20 such that the LCD module 20 and the opening 12 overlap at their peripheries and this overlapped portion is formed as a mounting surface 13 positioned lower than the inner surface 11 of the case frame 10.

Preferably, EMI spray is coated all over the inner surface 11 of the case frame 10 to provide shielding. The EMI spray shielding blocks electronic waves and also functions as a discharge path in which external static electricity is discharged by internal grounding. Therefore, while not shown, the EMI shielding is electrically connected to a ground formed on a main board (not shown) of the terminal 100. If space permits, the EMI spray can be coated to a predetermined width on the mounting surface 13 for mounting the LCD module 20 thereon.

Figure 8:
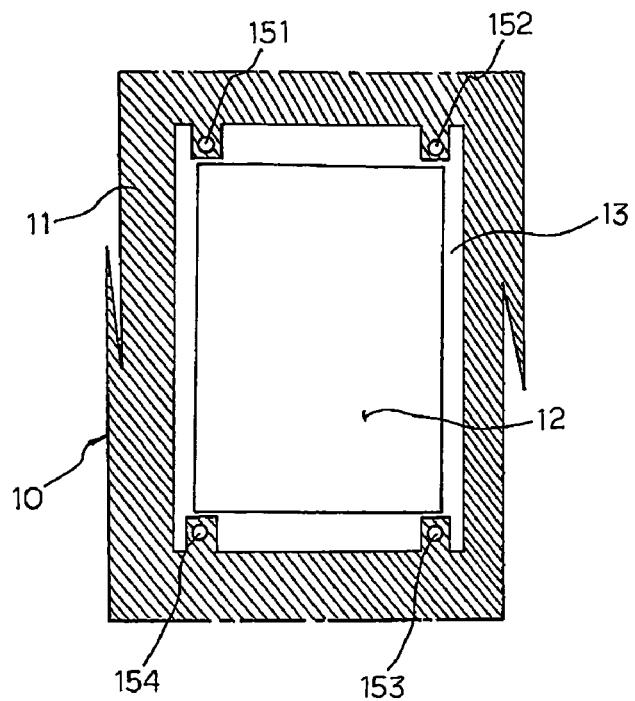
FIGS. 8 and 9 are partial rear plan views of a case frame according to other embodiments of the present invention.
Figure 9:
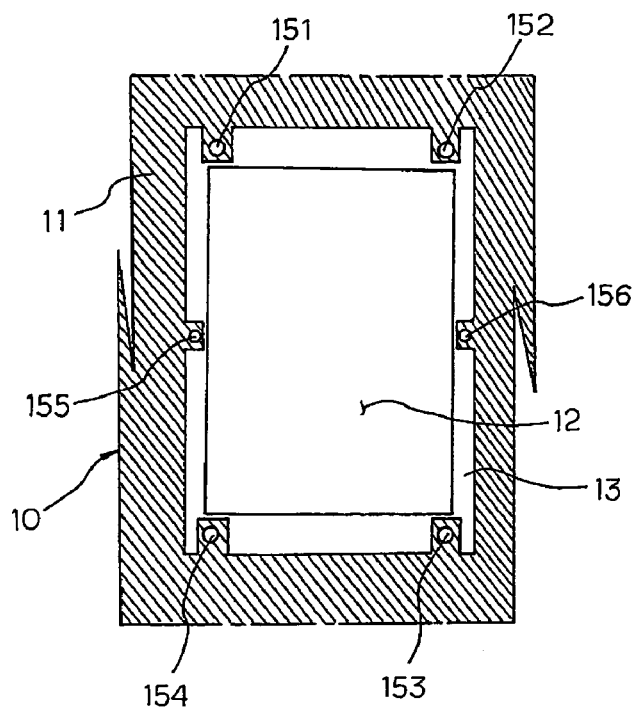

One or more through holes of a predetermined diameter 151 and 152 are preferably formed in the mounting surface 13. While one through hole is formed at each of the left and right corners of the mounting surface 13 in FIG. 3, four through holes 151 to 154 can be formed at four corners of the mounting surface, one at each corner, or six through holes 151 to 156 can be formed on the mounting surface, as illustrated in FIGS. 8 and 9. A predetermined conductive material is filled in the through holes 151 and 152 or coated on the inner circumferential surface of the through holes 151 and 152. This conductive material is electrically connected to the EMI shielding on the inner surface 11 of the case frame 10.

Figure 4:
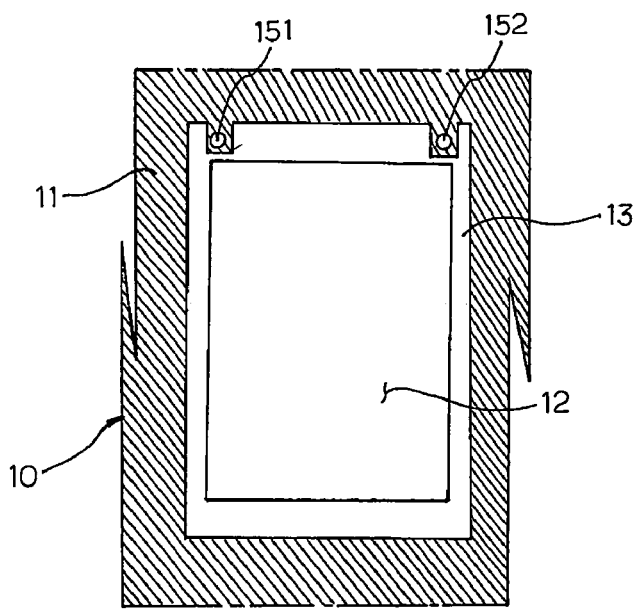
FIG. 4 is a partial plan view of the inner surface of the case frame on which an LCD module is to be mounted according to the embodiment of the present invention.

FIG. 4 is a plan view of the inner surface of the case frame on which the LCD module is to be mounted according to the present invention. A portion marked with slashed lines is an area of the inner surface 11 of the case frame 10 coated with the EMI spray. The EMI shielding covers the through holes 151 and 152 so that the EMI shielding is electrically connected to the through holes 151 and 152. Conductive foam as well as EMI spray is available as the conductive material. Also, a fine-wire cable or an FPC (Flexible Printed Circuit) can be used as the conductive material. That is, any known conductive means is available. Externally introduced static electricity is concentrated into the through holes 151 and 152 and grounded to the main board (not shown) of a terminal body through the conductive means across the EMI shielding on the inner surface 11 of the case frame 10.

It is more preferred that an LCD window 30 is further provided on the outer surface 16 of the case frame 10 to cover the through holes 151 and 152 to enhance the exterior appearance. Thus, the LCD window 30 covers the through holes 151 and 152 at the periphery thereof, as shown in FIG. 5.

Figure 5:
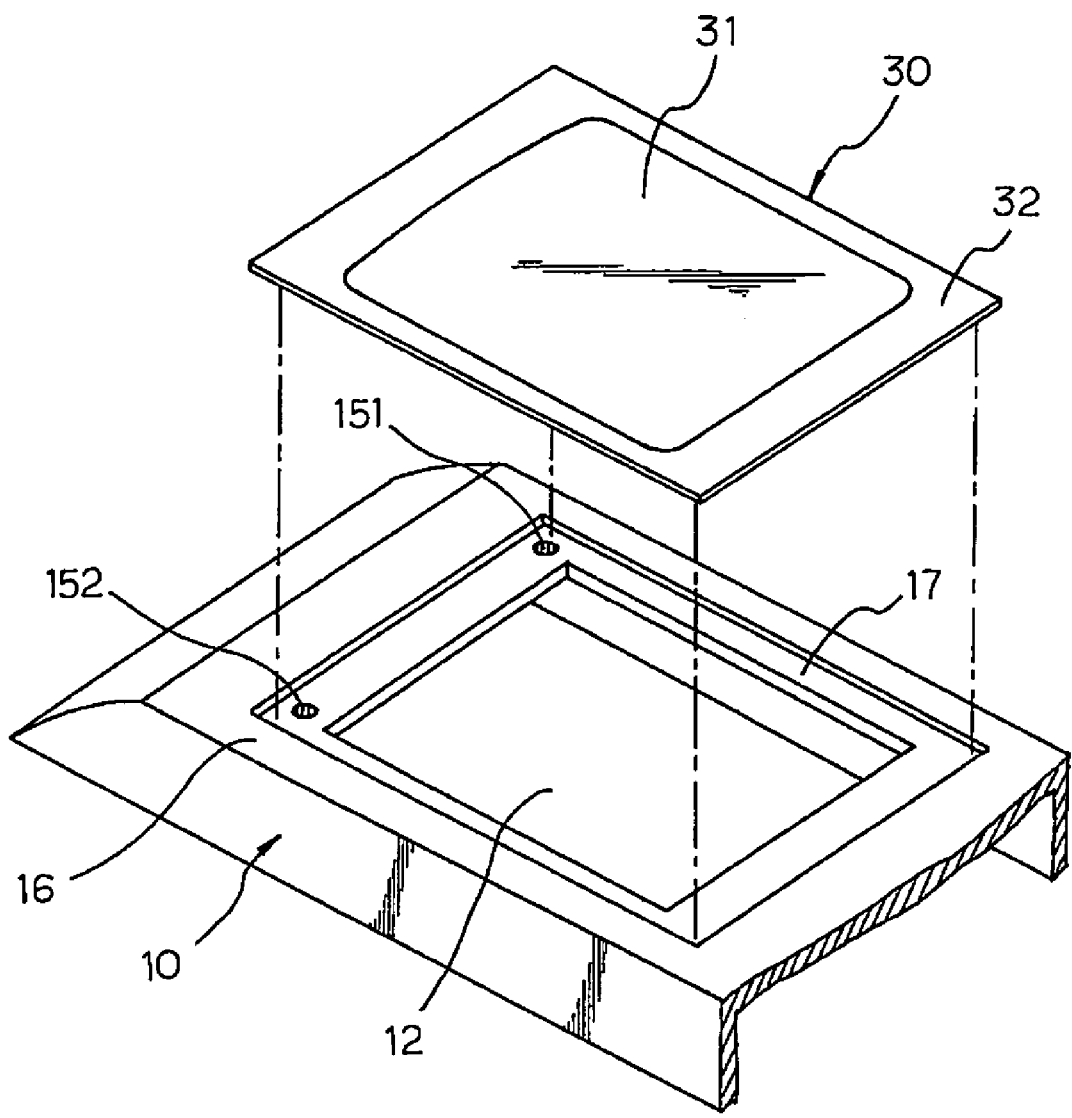
FIG. 5 is a partial front perspective view of the case frame with an LCD window mounting structure according to the embodiment of the present invention.
Figure 6:
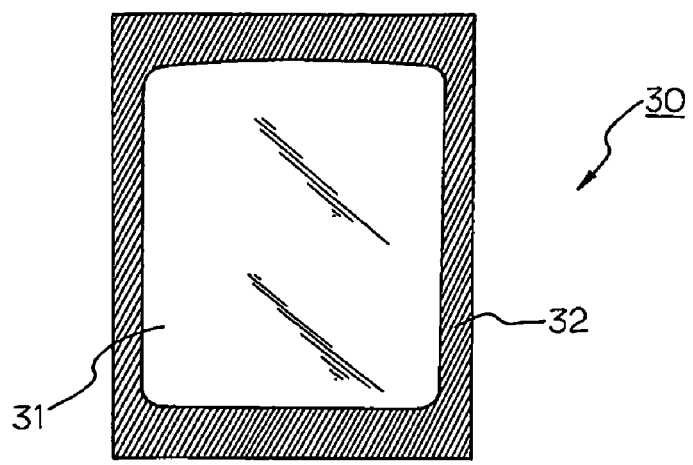
FIG. 6 is a plan view of an LCD window according to the embodiment of the present invention.

FIG. 5 is a partial frontal perspective view of the case frame with an LCD window mounting structure according to the present invention, and FIG. 6 is a plan view of the LCD window according to the present invention.

Referring to FIGS. 5 and 6, a mounting surface 17 is formed at a position lower than the outer surface 16 of the case frame 10 around the periphery of the opening 12, for mounting the LCD window 30 thereon. The LCD window 30 is provided, at the center thereof, with a transparent display window 31, and an attachment surface 32 marked with slash lines in FIG. 6 is formed to a predetermined width around the periphery of the display window 31. Preferably, the attachment surface 32 is as wide as the mounting surface 17 and fixed onto the front surface (i.e. outer surface) of the case frame 10 by bonding, for example. More preferably, the LCD window 30 is mounted onto the mounting surface 17 to be even with the outer surface 16 of the case frame 10.

A conductive material is coated or attached onto the attachment surface 32 to easily collect external static electricity and concentrate it into the through holes 151 and 152. The conductive material is preferably EMI spray.

Figure 7:
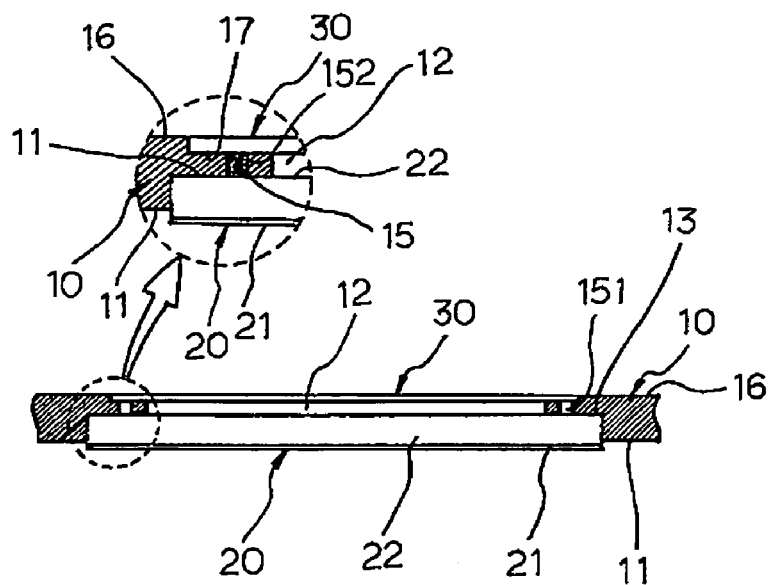
FIG. 7 is a sectional view of a portion of the wireless portable terminal in the state where the LCD window and the LCD module are fixed in the case frame according to the present invention.

FIG. 7 is a sectional view of a portion of the wireless portable terminal in the state where the LCD window and the LCD module are fixed on the case frame according to the present invention.

Referring to FIG. 7, the LCD module 20 is mounted on the mounting surface 13 defined on the inner surface 11 of the case frame 10, that is, around the periphery of the opening 12. While not shown, the connector (23 in FIG. 3) in the FPC 21 of the LCD module 20 is electrically connected to the terminal body. An enlarged portion circled with a dotted line shows a filler material 15 filled in the through hole 152. The filler 15 is a conductive material such as EMI spray or conductive foam or any other known conductive material. While not shown, a predetermined spacer or non-woven fabric is interposed between the mounting surface 13 and the LCD module 20 to provide cushioning.

An ESD test performed by the present applicant demonstrated that the wireless portable terminal had robustness against up to 15 KV after forming the through holes as illustrated in FIGS. 3 and 4, increased from robustness against 8 KV before forming the through holes.

As described above, the present invention advantageously provides an enhanced ESD structure and increases ESD robustness because a plurality of conductive through holes are formed on a case frame in a terminal to concentrate external static electricity into the conductive through holes.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. A liquid crystal display (LCD) module mounting structure in a terminal, for protecting an LCD module from an electro-static discharge (ESD), comprising:
   a case frame having a case inner surface and a case outer surface opposite to the case inner surface, the case inner surface including a first mounting surface and being coated with an inner electro-magnetic interference (EMI) shielding, the inner EMI shielding electrically connected to a ground of a main board of the terminal, the LCD module mounted on the first mounting surface; and
   at least one through hole formed in the case frame at the first mounting surface to penetrate from the case inner surface to the case outer surface, the at least one through hole receiving a conductive means electrically connected to the inner EMI shielding,
   whereby externally introduced static electricity is grounded inside the terminal along the at least one through hole.

2. The LCD module mounting structure of claim 1, wherein the conductive means is the inner EMI shielding extended into the at least one through hole.

3. The LCD module mounting structure of claim 1, wherein the conductive means is a conductive material filled in the at least one through hole.

4. The LCD module mounting structure of claim 1, wherein the first mounting surface has predetermined width and is positioned lower than the case inner surface.

5. The LCD module mounting structure of claim 1, wherein the at least one through hole is formed on each corner of the first mounting surface.

6. The LCD module mounting structure of claim 1, further comprising an LCD window wider than the LCD module, mounted on the case outer surface to protect the LCD module.

7. The LCD module mounting structure of claim 6, wherein the LCD window is mounted on a second mounting surface formed at a position lower than the case outer surface so that a top surface of the LCD window is even with or lower than the case outer surface of the case frame.

8. The LCD module mounting structure of claim 7, wherein the at least one through hole is formed on the second mounting surface where the LCD window is overlapped with the case frame.

9. The LCD module mounting structure of claim 7, wherein the LCD window includes a transparent display window and an attachment surface attached onto the second mounting surface around the periphery of the display window.

10. The LCD module mounting structure of claim 7, wherein a conductive material is attached or coated on the case outer surface in order to conduct the externally introduced static electricity.

11. A liquid crystal display (LCD) module mounting structure for electro-static discharge (ESD) protection in a terminal, comprising:
   a case frame having a case inner surface, a case outer surface oposite to the case inner surface, the case inner surface including a first mounting surface and being coated with an inner electro-magnetie interference EMI shielding, and an opening of a predetermined size, the inner EMI shielding electrically connected to a around of a main board of the terminal;
   an LCD module mounted on the first mounting surface to be exposed through the opening;
   at least one through hole of a predetermined diameter, formed in the case frame at the first mounting surface to penetrate from the case inner surface to the case outer surface and;
   conductive means being disposed in the at least one throuhh hole and electrically connecting to the inner EMI shielding,
   whereby externally introduced static electricity is grounded inside the terminal along the at least one through hole.

12. The LCD module mounting structure of claim 11, further comprising an LCD window mounted on the case outer surface to cover the opening, for protection of the LCD module.

13. The LCD module mounting structure of claim 12, wherein the LCD window includes a transparent display window and an attachment surface attached onto the periphery of the opening around the periphery of the display window.

14. The LCD module mounting structure of claim 13, wherein a conductive material is provided on the attachment surface in order to conduct external static electricity.

15. The LCD module mounting structure of claim 14, wherein the first mounting surface ia at a position lower than the case inner surface, and a second mounting surface is formed at a portion of the case outer surface corresponding to the attachment surface of the LCD window.

16. The LCD module mounting structure of claim 15, wherein the at least one through hole penetrates formed on each corner of the first mounting surface.

17. The LCD module mounting structure of claim 16, wherein the conductive means is the inner EMI shielding extended into the at least one through hole.

18. The LCD module mounting structure of claim 16, wherein the conductive means is a conductive material filled in the at least one through hole and electrically connected to the inner EMI shielding.

* * * * *